United States Patent [19]

Spaulding

[11] Patent Number: 5,506,579
[45] Date of Patent: Apr. 9, 1996

[54] ABSOLUTE ENCODER USING MULTIPHASE ANALOG SIGNALS

[75] Inventor: Carl P. Spaulding, San Marino, Calif.

[73] Assignee: TRJ & Company, Duarte, Calif.

[21] Appl. No.: 711,034

[22] Filed: Jun. 6, 1991

[51] Int. Cl.$^6$ ..................................... H03M 1/30
[52] U.S. Cl. .................. 341/11; 341/13; 250/231.18
[58] Field of Search ........................ 341/8, 9, 10, 11, 341/13, 15, 16; 250/231.18, 231.17, 231.16, 231.14

[56] References Cited

U.S. PATENT DOCUMENTS

| | | | |
|---|---|---|---|
| 4,524,347 | 6/1985 | Rogers . | |
| 5,012,238 | 4/1991 | Hayashi et al. | 341/15 |
| 5,041,829 | 8/1991 | Garrett | 341/13 |
| 5,121,116 | 6/1992 | Taniguchi | 341/13 X |
| 5,126,736 | 6/1992 | Okutani | 341/13 |
| 5,173,693 | 12/1992 | Fry | 341/15 |

*Primary Examiner*—Howard L. Williams
*Attorney, Agent, or Firm*—Christie, Parker & Hale

[57] ABSTRACT

The absolute encoder utilizes two or more sensors per track and the output of each sensor is modulated by the track to generate a multiphase analog signal from each track. An analog to digital converter converts each analog signal to a digital value. The multiphase cyclic digital values are combined into a single linear output per track that increases linearly from zero to a maximum over the full span of the measuring scale. Corrections are made for zero drift in the analog signals, for changes in amplitude (gain) of the analog signals and for deviations in the linear values from a perfect straight line. When measuring rotary displacement the methods disclosed may be used to combine the outputs of the geared scales.

23 Claims, 17 Drawing Sheets

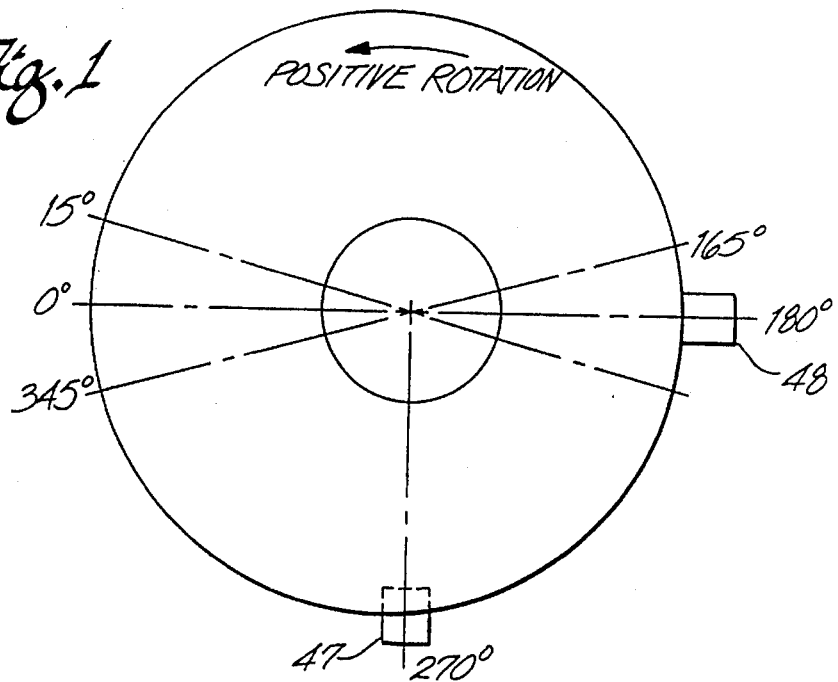
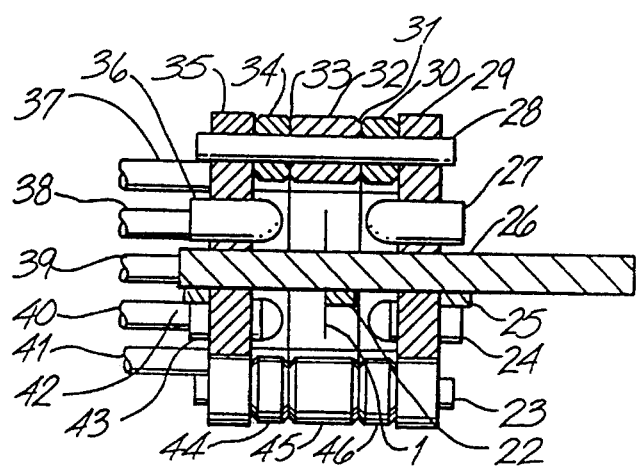
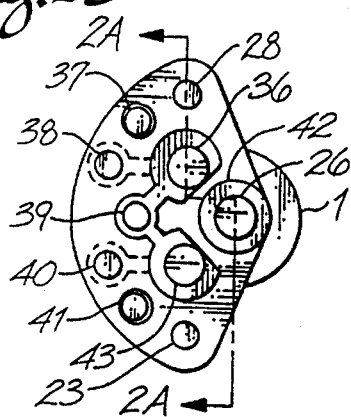
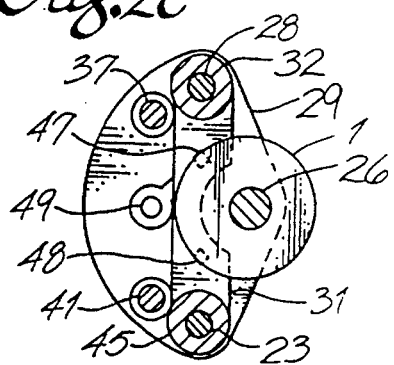

DY/DX
ARBITRARY
UNITS

PARTS PER
1000 ERROR,
LOWER CURVE

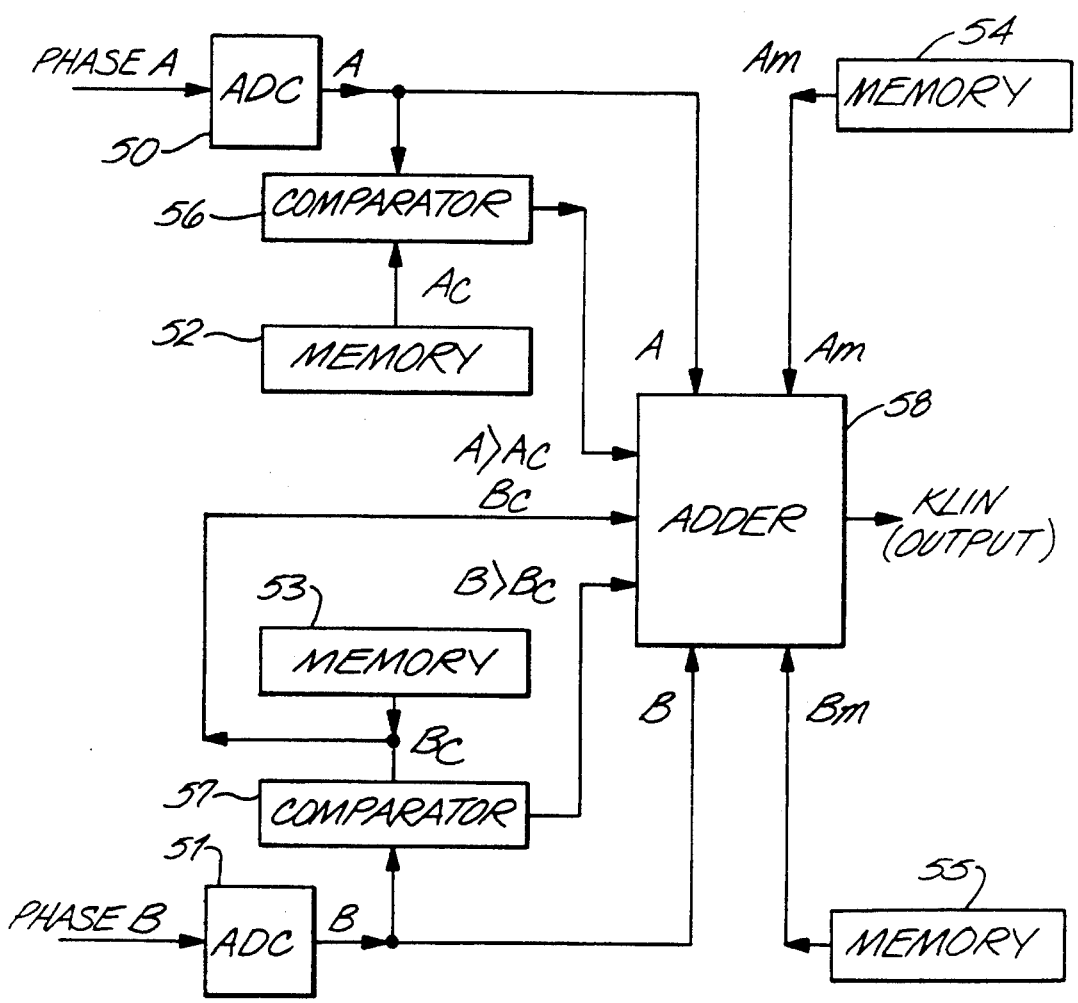

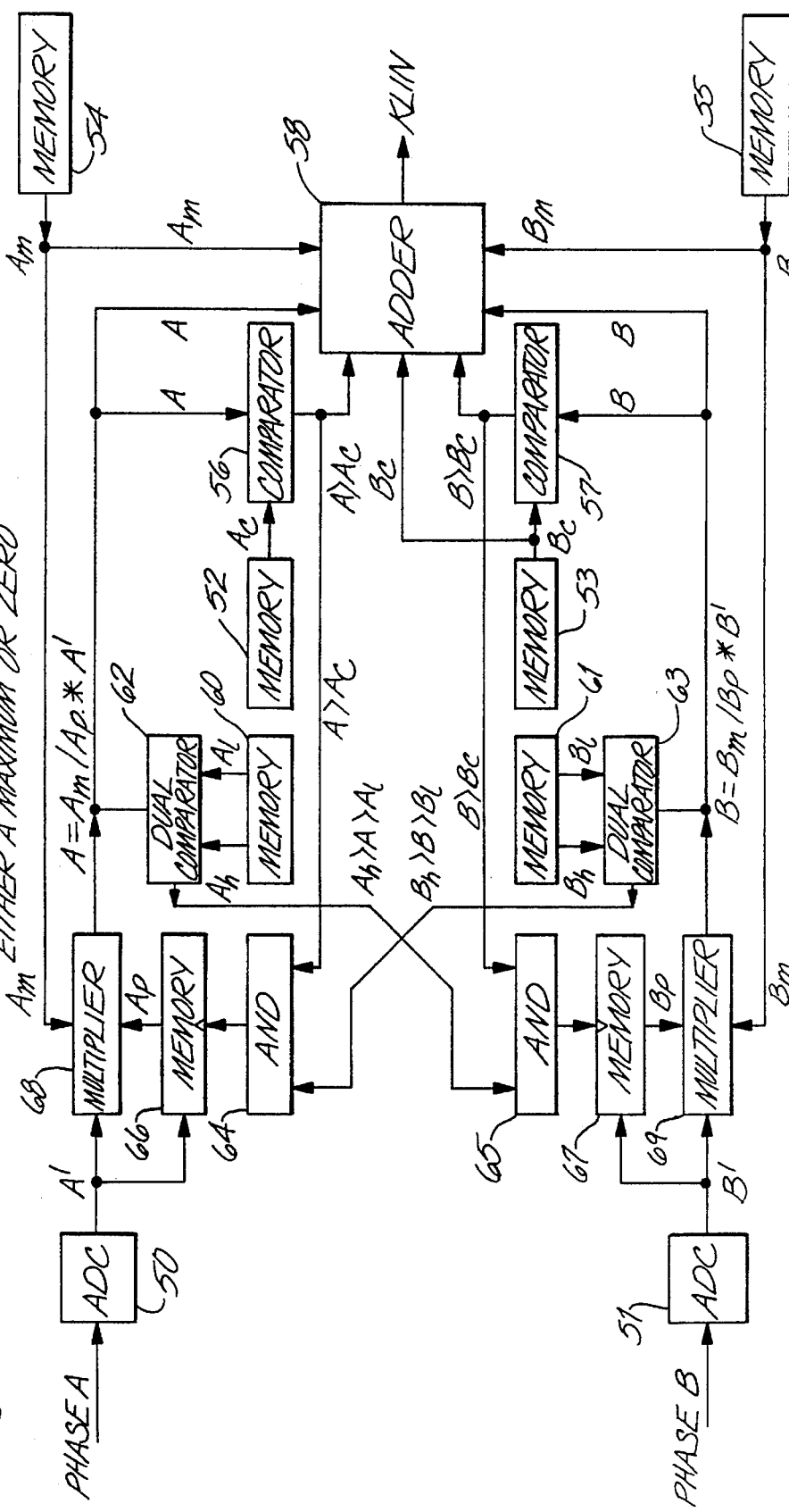

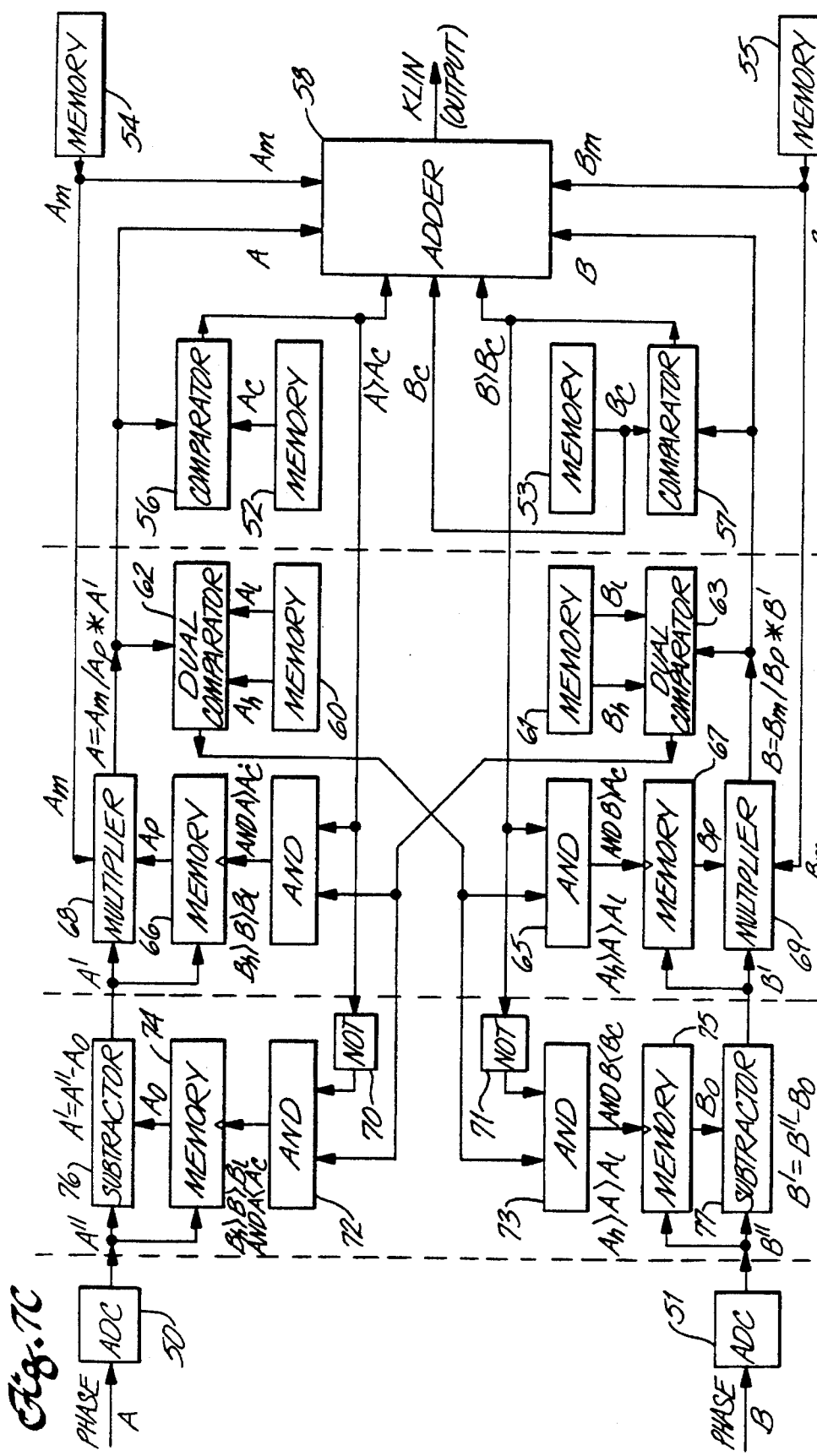

THREE PHASE ENCODER
DY/DX IS ZERO AT MIN. AND MAX.

ONE PHASE OF A 3 PHASE ENCODER
Y AND ABSOLUTE VALUE OF DY/DX

ABSOLUTE VALUE OF DY/DX
FOR EACH PHASE OF A 3 PHASE ENCODER

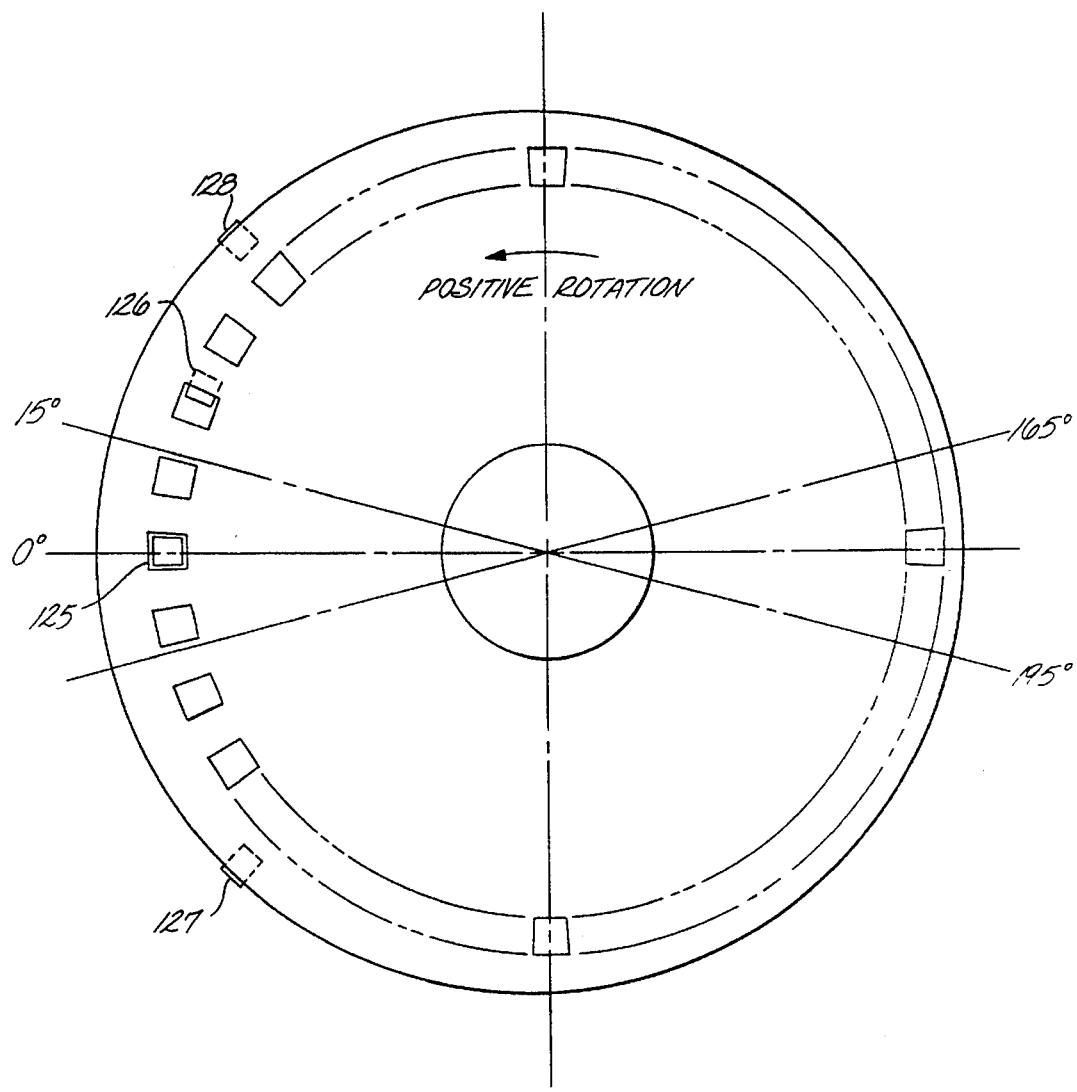

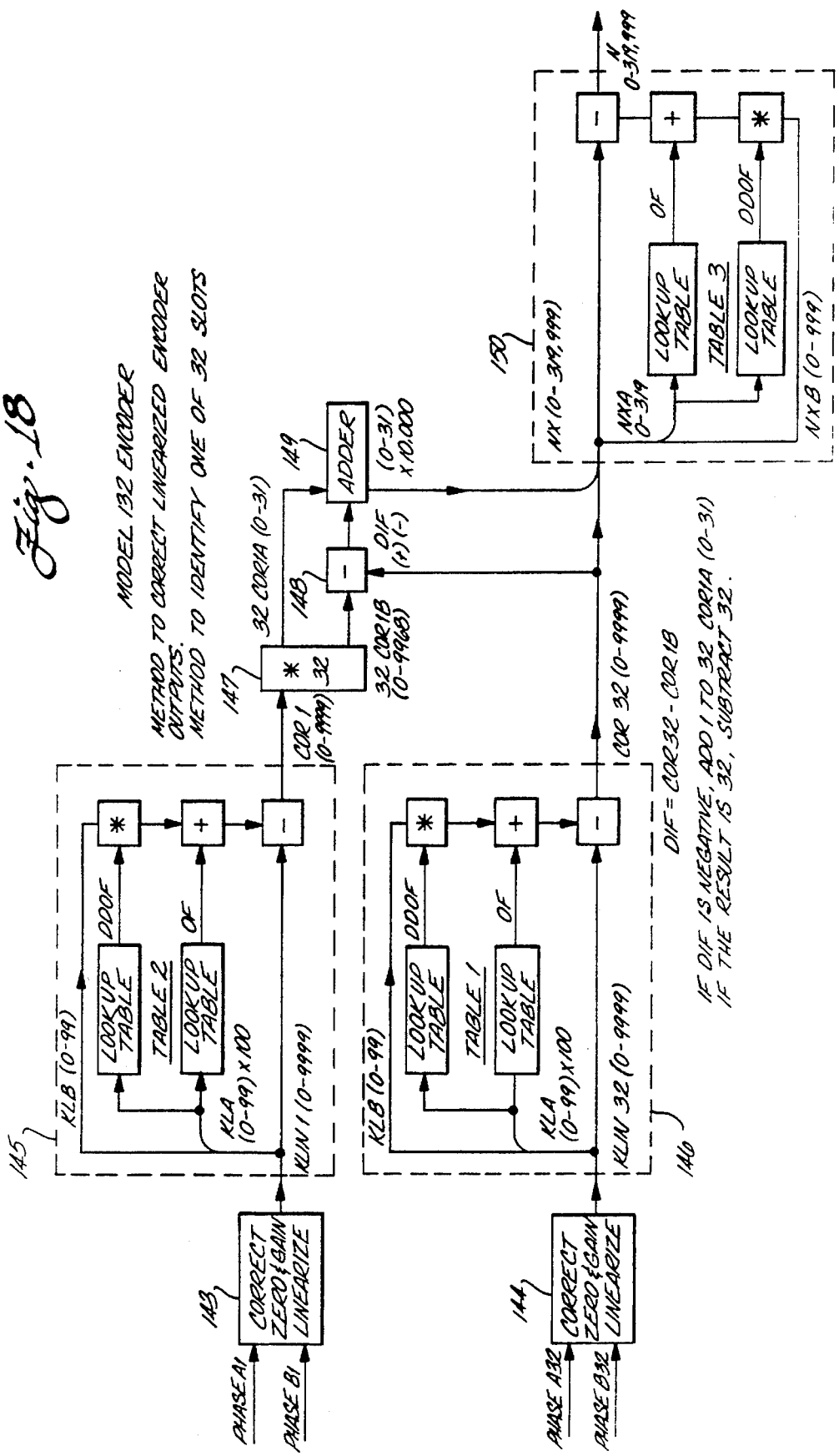

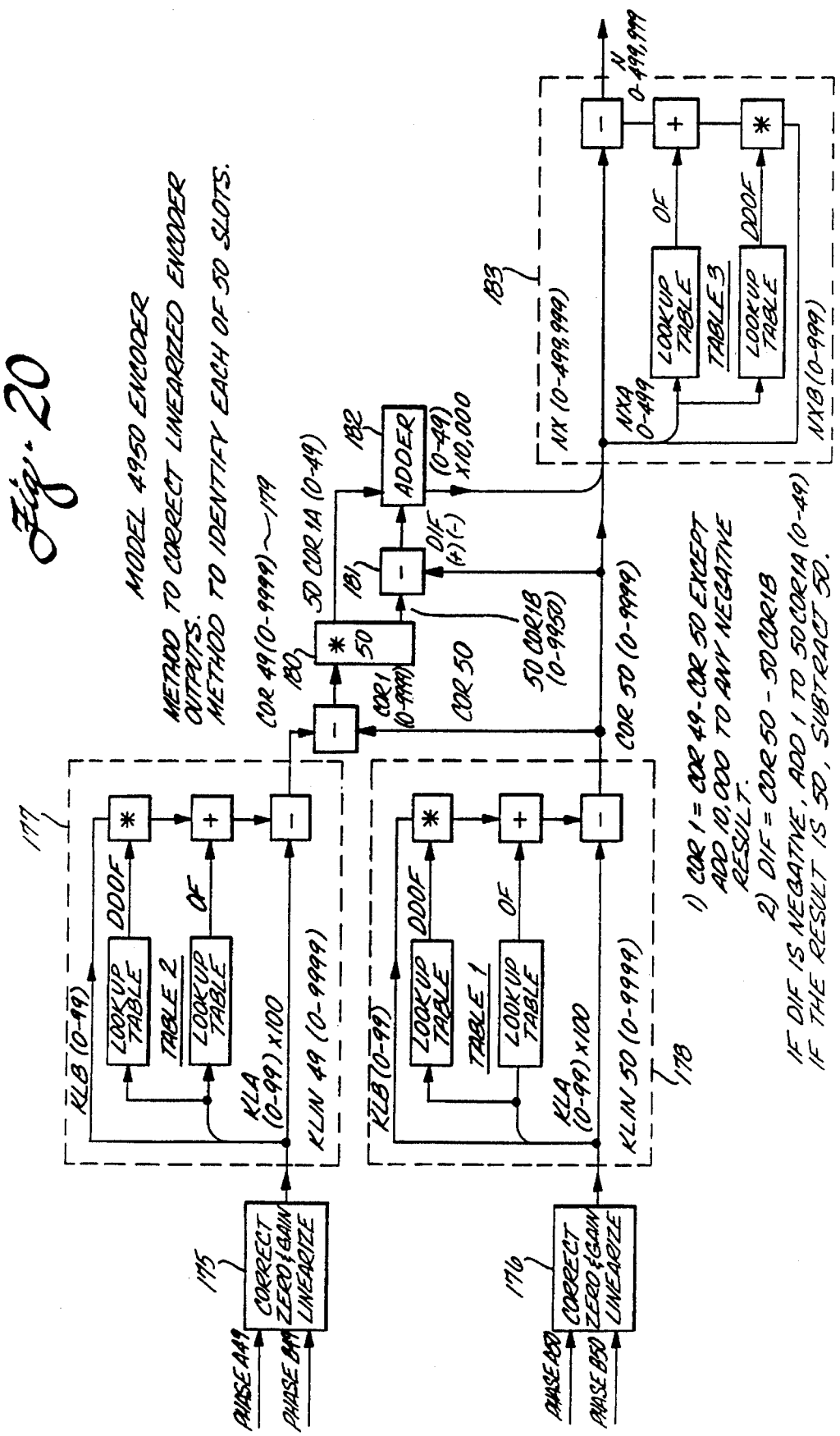

ABSOLUTE ENCODER USING MULTIPHASE ANALOG SIGNALS

FIELD OF THE INVENTION

This invention relates in general to absolute encoders, and more particularly to an absolute encoder having multiphase analog outputs used in combination with digital circuits that linearize and correct the multiphase analog outputs.

BACKGROUND OF THE INVENTION

Absolute encoders are known for providing an output indication of the position of a sensing head relative to a measuring scale. For sensing rotary displacement, the scale is in the form of a disc with one or more tracks with one or more sensors per track. For sensing linear displacement, the scale is an elongated member containing one or more linearly arranged parallel tracks with one or more sensors per track. The tracks are often formed of optically responsive segments, which segments are light transmissive or light reflective, but the tracks can alternatively be of other forms such as magnetic, capacitive or inductive. Higher resolution is achieved by increasing the number of tracks.

SUMMARY OF THE INVENTION

The present invention employs two or more sensors per track. The output of each sensor is modulated by the track to generate a multiphase analog signal from each track. An analog to digital converter (ADC) converts each analog signal to a digital value. A novel method is employed to combine the multiphase cyclic digital values into a single linear output per track. Other novel methods are employed to correct, (1) zero drift in the analog signals, (2) changes in amplitude (gain) of the analog signals, (3) deviations in the linear values from a perfect straight line. These correction methods are optional and can be employed in any combination. The invention applies to one, two or more tracks per measuring scale and the invention includes novel methods of combining the signals from each track to obtain a single output that increases linearly from zero to a maximum over the full span of the measuring scale. When measuring rotary displacement the methods disclosed may be used to combine the outputs of geared scales.

The methods used to linearize and correct the digital values are illustrated and described in terms of hard wired circuits. It is clear, however, that the methods described may be executed conveniently using any general purpose microcontroller or digital signal processor integrated circuit.

SOME FEATURES OF THE INVENTION

A. Clipped Multiphase Analog Signals with 1 Cycle Per Revolution
  1. Use periphery of disc to get 1 cycler per revolution
  2. Correcting for zero drift
  3. Correcting for changes in amplitude
  4. Converting multiphase signals to single phase linear signals.
  5. An example of a two phase output that is practical approximation of the requirements of this invention.
  6. Two examples of three phase signals that meet the requirements of this invention.
B. Correcting for Non-Linearity
  1. Repeatability
  2. Interpolation
  3. Simplified correction methods
C. An Encoder that Combines 1 Cycle/Rev. and N Cycles/Rev. to Increase the Resolution of the Encoder N Times.
  1. Use the periphery of the disc to get 1 cycle/rev. and a circular row of N slots to get N cycles/rev.
  2. For example, combine A32, B32, A1, and B1 to obtain linear ouput that repeats once per revolution with 32 times the resolution.
D. An Encoder that Combines N Cycles/Rev. and N−1 Cycles/Rev. to Increase the Resoltuion of the Encoder N Times.
  1. Use a circular row of N slots and a second circular row of N−1 (or N+1) slots to get the absolute value of N cycles/rev.
  2. For example, combine A50, B50, A49, and B49 to obtain a linear output that repeats once per revolution with 50 times the resolution of the 50 slot track.

LIST OF FIGURES

FIG. 1. Disc and slits to generate a 2 phase analog signal with one cycle per revolution. (Model 10)

FIGS. 2A, B, C. Mechanical design of the Model 10

FIG. 3. Graph of the 2 phase analog signals from the Model 10

FIG. 4. Graph of the absolute value of the slope (DY/DX) of the 2 phase analog signals FIG. 5. Comparison of the actual to the ideal graph of the solpe FIG. 6. Graph of the sum of the slopes of FIG. 4 and of the error resulting from the non ideal output FIG. 7A. Block diagram of a method to combine the digitized values of the 2 phase signals of FIG. 3 to obtain a single phase linear output FIG. 7B. FIG. 7A plus a method to correct the amplitude of the analog signals FIG. 7C. FIG. 7B plus a method to correct for zero drift in the analog signals FIG. 7D. An alternate method to correct the amplitude of the analog signals using an analog multiplier FIG. 8. Disc and slits to generate a 3 phase analog signal with one cycle per revolution FIG. 9. Graph of the 3 phase analog signals obtained from the disc and slits shown in FIG. 8

FIG. 10. One phase of the signal from FIG. 9 and the absolute value of the slope (DY/DX) the signal FIG. 11. Graph of the absolute value of the slopes of the 3 phase signals from FIG. 9

FIG. 12. Block diagram of a method to correct the amplitude of a 3 phase signal and to combine the signals to obtain a single phase linear output FIG. 13. Graph of one phase of an alternate 3 phase analog signal and a graph of the absolute value of the slope of the alternate signal FIG. 14. Graph of one cycle of an alternate 3 phase signal FIG. 15. Graph of the absolute value of the slopes of the 3 phase signal from FIG. 14

FIG. 16A. A method of correcting the linear output using interpolation

FIG. 16B. A simplified method of correcting the linear output

FIG. 16C. Another simplified method of correcting the linear output

FIG. 17. The disc and slits of FIG. 1 with the addition of a circular row of slots and the associated slits FIG. 18. Block diagram of a method to combine the digitized values of the analog signals obtained from the disc of FIG. 17 to obtain a single phase output with increased resolution FIG. 19. A disc with 49 slots in the outer row and 50 slots in the inner row with the slits required to obtain a 2 phase output from each row of slots FIG. 20. Block diagram of a method to combine the digitized values of the analog signals obtained from the disc of FIG. 19 to obtain a single phase output

A. ENCODERS USING CLIPPED MULTIPHASE ANALOG SIGNALS WITH 1 CYCLE PER REVOLUTION

1. An Encoder that uses the Periphery of a Disc to Get a Two Phase Analog Signal with 1 Cycle per Revolution.

FIG. 1 shows a measuring scale designed to measure rotary position over a range of one revolution. The measuring scale is an opaque disc 1 with a single track formed by the periphery of the disc. There is a center hole in the disc which is used to mount the disc on a rotating shaft. All angles and radii described in this example are measured from the center of this hole. This example employs two optical sensors that generate a two phase analog signal. The two source-sensor pairs are spaced 90 degrees apart at the periphery of the disc. The optical path between the source and the sensor is limited by a pair of identical slit plates, one on each side of the disc, that confine the light path to area of slits 46 and 47.

The disc 1 has a maximum radius that is constant over the angle from 345 degrees to 0 degrees to 15 degrees. The radius is a minimum over the angle from 165 degrees to 180 degrees to 195 degrees. From 15 degrees to 165 degrees the periphery of the disc forms a spiral in which the radius (R) is reduced a constant rate with respect to the angle (O). In this example DR/DO is 0.00012 inch per degree. This has the result that the maximum radius is 0.018 inches greater than the minimum radius. The periphery of the disc between 195 degrees and 345 degrees is also a spiral with the radius increasing at the rate of 0.00012 inches per degree.

In FIG. 1, the disc is shown in the angular position where slit 48 is totally exposed and slit 47 is one-half eclipsed by the disc. I have selected the output of slit 48 to be phase A and the output from slit 47 to be phase B. I have arbitarily selected this position as the zero reference position of the disc. I have also arbitrarily selected counter-clockwise rotation of the disc in this view to produce an increasing linear output from the signal conditioning circuits. In other words, the signal conditioning circuits will be designed to produce an output that is zero and increasing when the output from phase A is a maximum and when the output from phase B is half-way between maximum and minimum and is decreasing.

The minimum radius of slits 47 and 48 is equal to the minimum radius of the disc. The maximum radius of slits 47 and 48 is equal to the maximum radius of the disc. The sides of the disc are parallel to a line through the center of the disc and the center of the slit. The area of the slit must be less than the active area of the light source and light sensor. The width is usually equal to or less than the difference between the maximum and mimimum radius of the slit. In this example, the width is 0.018 inches and is equal to the difference between the maximum and minimum radius of the slit.

To summarize, FIG. 1 shows a rotary optical encoder that produces two phase analog output with one cycle corresponding to one revolution of the disc.

FIGS. 2A, 2B, and 2C show a mechanical assembly of the disc 1, the two slit plates 31 and 33, the light emitting diodes 24 and 27 (the sources), and the phototransistors 36 and 43 (the sensors). The center hole of the disc locates the disc on shaft 26. The disc is fixed in position by a cylindrical keeper 22 that is cemented both to the shaft and to the disc. The shaft rotates in bearings which in this example are simply holes drilled in the source board 29 and the sensor board 35. The axial location of the shaft is determined by thrust bearings 25 and 42 which are cemented to the shaft. Holes in the slit plates 31 and 33 locate on pins 23 and 28 which in turn are a press fit in holes drilled in the source and sensor boards. The axial location of the slit plates is determined by spacers 30, 32, 34, 44, 45 and 46.

The sources are located by holes drilled in the source board and are soldered to etched foil conductors which in turn are soldered to wires 37 and 41 which supply electrical current to the sources. In this example, the sources are connected in series by a feed-thru connection 49 and the same current flows through both sources. The sensors are located by holes drilled in the sensor board and are soldered to etched foil conductors which in turn are soldered to wires 38, 39 and 40. Wire 40 is connected to a source of positive voltage, typically 5 to 25 volts. Wires 38 and 40 carry the output current from sensors 36 and 43. The output analog current is proportional to the amount of light arriving at the sensors.

The geometric relationship of the sources, the sensors, the slit plates, and the disc shown in FIGS. 2A, 2B and 2C has the result that illumination of the disc falls to zero at the edges of the shadow of the slits and rises to a maximum at the center of the illuminated area. As a consequence the change in the amount of light arriving at the sensor (DY) for a change in the illuminated area of the slit is small near the edge of the slit and is a maximum near the center of the slit. In paragraph 5, I discuss how this effect is used to improve the linearity of the encoder output.

2. Compensating for Zero Drift

To correct zero drift in the analog signals, I first convert the analog signals to digital values and store the minimum digital value of each analog signal. I have designed the measuring scale so that each of the two phase signals remain at the minimum value over 30 degrees of the input. This permits me to store in fixed computer memory, a range of digital values of phase B that identifies when phase A is at a minimum. In this example, if phase B is between 37.5% and 62.5% of full range, then phase A is a minimum or a maximum. If phase A is greater than one-half its range, then it is stored as a maximum and if it is less than one-half its range, then it is stored as a minimum. Similarly, phase A is between 37.5% and 62.5% of full range when phase B is a minimum or a maximum. To allow for variations that will occur during the manufacturing process the range is reduced, for example to 40% to 60%.

To correct for zero drift, I subtract the stored mimimum value from all subsequent digital values of the related analog signal.

3. Compensating for Changes in Amplitude

To correct for changes in the amplitude of the analog signals, I use the same procedure to store the maximum digital value of each analog signal. For each analog input, the stored maximum value is used to compute a gain factor. The numerical value of the gain factor is the desired maximum value divided by the difference of the stored maximum value and the stored minimum value.

The corrected digital output of each phase is called the normalized value. The normalized value of any phase is equal to the gain factor of that phase multiplied by the difference of current value of the output of the analog to digital converter and the stored minimum value of that phase.

4. Converting Multiphase Signals to Single Phase Linear Signals.

I have also designed the measuring scale to shape the multiphase signals so that they can be combined to form a single phase signal whose output increases linearly in proportion to the mechanical motion of the measuring scale. A characteristic of a linear output is that the ratio of the incremental output DY to the incremental input DX is a constant. I have discovered that I can simplify the computation of the single phase linear output if the sum of absolute values of the ratio DY/DX for each phase of the multiphase signals is a constant.

The method used to combine the normalized multiphase signals to obtain a linear single phase output also requires that at the minimum and maximum values of the multiphase signals the ratio DY/DX must be zero over a definite range of values of the input X. As described in the previous paragraphs, this feature is also required for the operation of the circuits used to correct for zero drift and to correct for changes in signal amplitude.

It is possible to devise many different multiphase analog signals that meet these two requirements I. that the value DY/DX be zero for at least 1/25 of a cycle at the maximum and minimum values of Y for each of the multiphase signals, and II. that the absolute values of DY/DX for each phase when added together will equal a constant.

5. An Example of a Two Phase Encoder Output.

FIG. 3 is an example of a set of two phase signals that meet requirement I and closely approximate requirement II. The slope DY/DX is zero over 30 degrees at both the minimum and maximum values of the signals (requirement I). The absolute value of the slopes DY/DX of phase A and phase B is shown in FIG. 4. The shape of these curves reflects the non-uniform illumination of the disc discussed in paragraph 1. The sum of these slopes is not exactly constant, but I will show first that the error is small and secondly I will show a method to correct the result and eliminate the error. FIG. 5 shows both the ideal values and the practical values of DY/DX for phase A. The curved line shows the slope obtained from the optical encoders described in paragraph 1. The ideal slope is constant at the maximum value of the elope over 30 degrees of the input as shown by the second curve in FIG. 5. I will demonstrate by this example that small deviations from the ideal waveshape produce acceptable errors in the linearized output. This disclosure will also describe methods to remove these and other errors from the final output.

The upper curve in FIG. 6 shows the sum of the slopes from FIG. 4. Requirement II states that this sum should be a constant. In this example, the sum varies from a constant by about 10%. The lower curve shows the resultant error in the linearized output obtained from the signals shown in FIG. 3. The error is about + or −1 part per 1000 (0.1%) of the maximum linear output. This error is small compared to other errors in a typical encoder and is acceptable. This error and other encoder errors are repeatable and can be corrected by the methods described in this disclosure.

FIG. 7A is a block diagram of a method of combining the normalized values of a two phase encoder to obtain an output KLIN whose amplitude is proportional to the mechanical displacement of the input X. FIG. 7B is an expansion of FIG. 7A with the addition of the blocks required to correct the amplitude of the analog signals. FIG. 7C is an expansion of FIG. 7B with the addition of the blocks required to correct for zero drift in the analog signals. FIG. 7D is a block diagram of an alternate method to correct the amplitude of the analog signal. The method shown in 4D uses the analog to digital converter as an analog multiplier as a substitute for the digital multiplier shown in FIG. 11B. In some applications the method shown in FIG. 7D may increase the speed and/or reduce the cost of the signal processing circuits.

6. Two Examples of Three Phase Signals that Meet These Requirements.

FIG. 8 shows a disc similar to FIG. 1 modified to produce a three phase output. The disc has a maximum radius that is constant over the angle from 330 degrees to 0 degrees to 30 degrees. The radius is a minimum over the angle from 150 degrees to 180 degrees to 210 degrees. From 30 degrees to 150 degrees the periphery of the disc forms a spiral in which the radius (R) is reduced a constant rate with respect to the angle (O). In this example DR/DO is 0.00015 inch per degree. This has the result that the maximum radius is 0.018 inches greater than the minimum radius. The periphery of the disc between 210 degrees and 330 degrees is also a spiral with the radius increasing at the rate of 0.00015 inches per degree.

In FIG. 8, the disc is shown in the angular position where slit 98 is totally exposed. Slits 97 and 99 are one-fourth eclipsed by the disc. Because of the non-uniform illumination discussed in paragraph 1, the normalized output at this position is approximately ⅞ of the maximum. I have selected the output of slit 98 to be phase A, the output from slit 97 to be phase B, and the output from slit 99 to be phase C. I have arbitarily selected this position as the zero reference position of the disc. I have also arbitrarily selected counter-clockwise rotation of the disc in this view to produce an increasing linear output from the signal conditioning circuits. In other words, the signal conditioning circuits are designed to produce an output that is zero and increasing when the output from phase A is a maximum and when the normalized output from phase B is about ⅞ of the maximum and is decreasing. At zero, the normalized output from phase C is equal to phase B and is increasing.

The minimum radius of slits 97, 98, and 99 is equal to the minimum radius of the disc. The maximum radius of elite 97, 98, and 99 is equal to the maximum radius of the disc. The sides of the disc are parallel to a line through the center of the disc and the center of the slit. The area of the slit must be less than the active area of the light source and light sensor. The width is usually equal to or less than the difference between the maximum and mimimum radius of the slit. In this example, the width is 0.012 inches and is less than the difference between the maximum and minimum radius of the slit.

To summarize, FIG. 8 shows a rotary optical encoder disc and slit layout that produces a three phase analog output with one cycle corresponding to one revolution of the disc. One example of a suitable three phase signal is shown in FIG. 9. In this example, full scale input (X) is 360 degrees. The maximum value of the normalized output (Y) is 10,000 and the minimum value is zero. At the maximum and minimum values, the output is constant and DY/DX is zero over a range of 60 degrees of the input.

FIG. 10 shows one phase of the three phase signal together with the absolute value of the slope. The encoder is designed so that the signal Y has a slope DY/DX that rises linearly from zero to a maximum slope that occurs when the output Y is one-half the maximum. The slope the decreases linearly so that the slope again reaches zero when the output Y reaches the maximum. An encoder similar to that shown in FIGS. 2A, 2B, and 2C but with three source sensor pairs and with a disc as shown in FIG. 8 produces an output that closely approximates the shape shown in FIG. 10. It is possible to produce similar outputs using magnetic, capacitive, or inductive transducers.

The values A', B', and C' are digital values corresponding to the analog inputs A1, B1, and C1. The values Ap, Bp, and Cp are the maximum values of A', B', and C'. The values Am, Bm, and Cm are the desired maximum values of the normalized outputs A, B, and C. The values Am, Bm, and Cm are stored in computor memory. The normalized value A is obtained by multiplying A' by the ratio Am/Ap. B and C are computed in a similar fashion. The peak value Ap is obtained by storing the value of A' when A is greater than Am/2 and when B and C are nearly equal (i.e., when the absolute value of the difference B–C is less than k, where k is a number stored in computor memory. In this example, k might be choosen as 1000) Bp and Cp are stored in a similar fashion.

Figure 12:
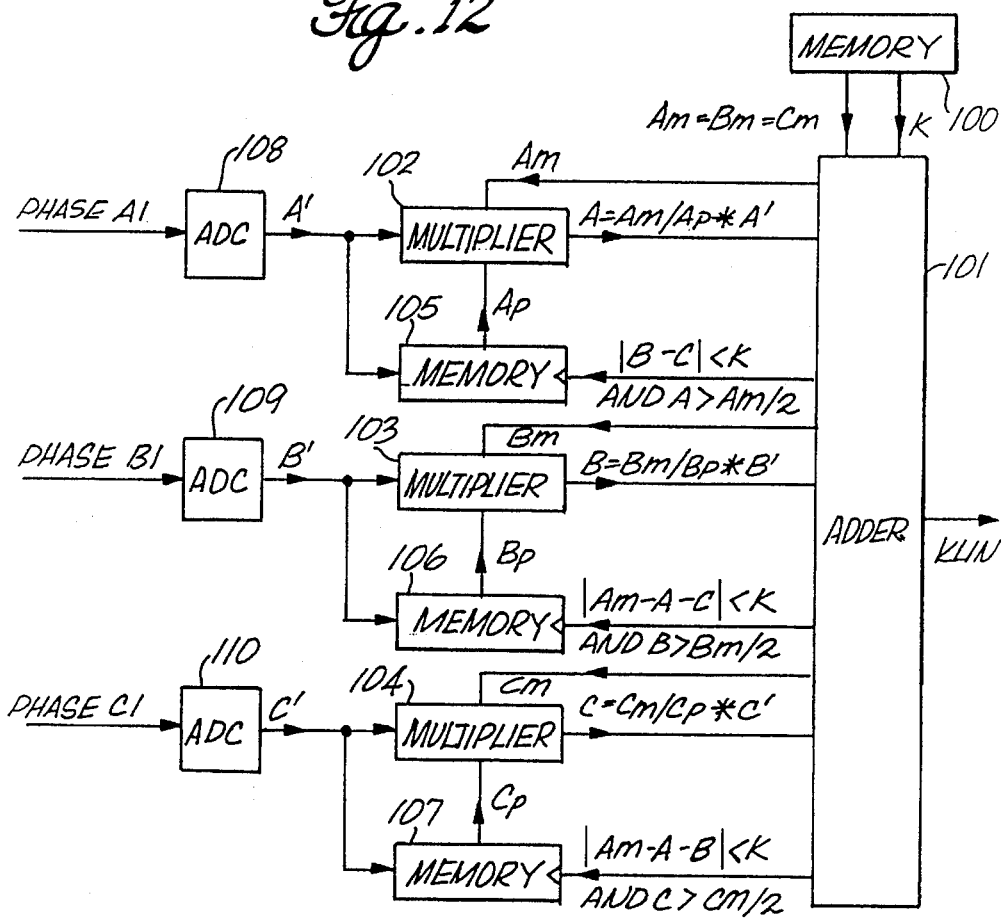
FIG. 12 is a block diagram of the method used to combine the signals from a three phase encoder first to correct for changes in signal amplitude and second to obtain a linear single phase output whose amplitude is proportional to the mechanical displacement of the input.

The linear output, KLIN, is obtained by adding or subtracting the normalized values A, B, and C using the rules listed in FIG. 12.

Figure 9:
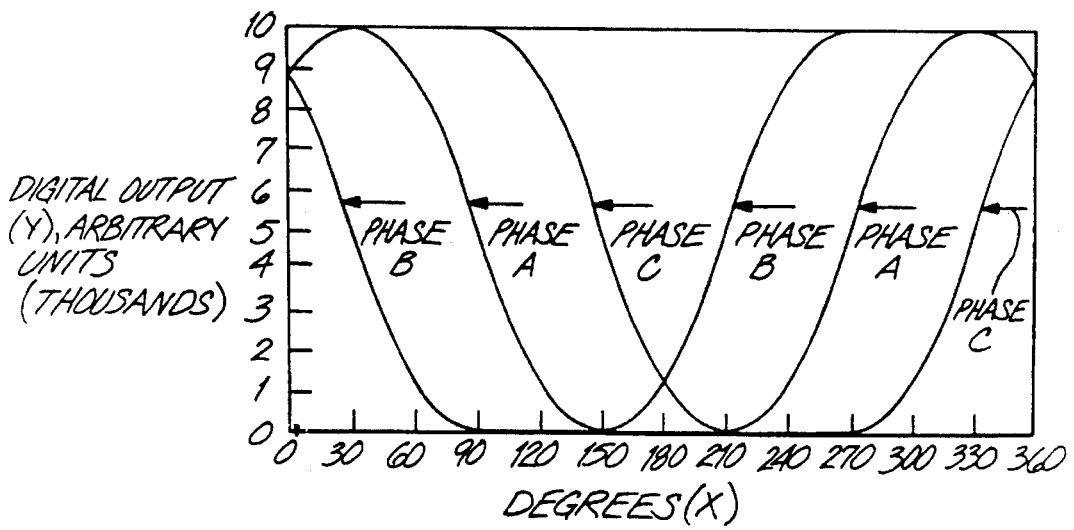
Figure 10:
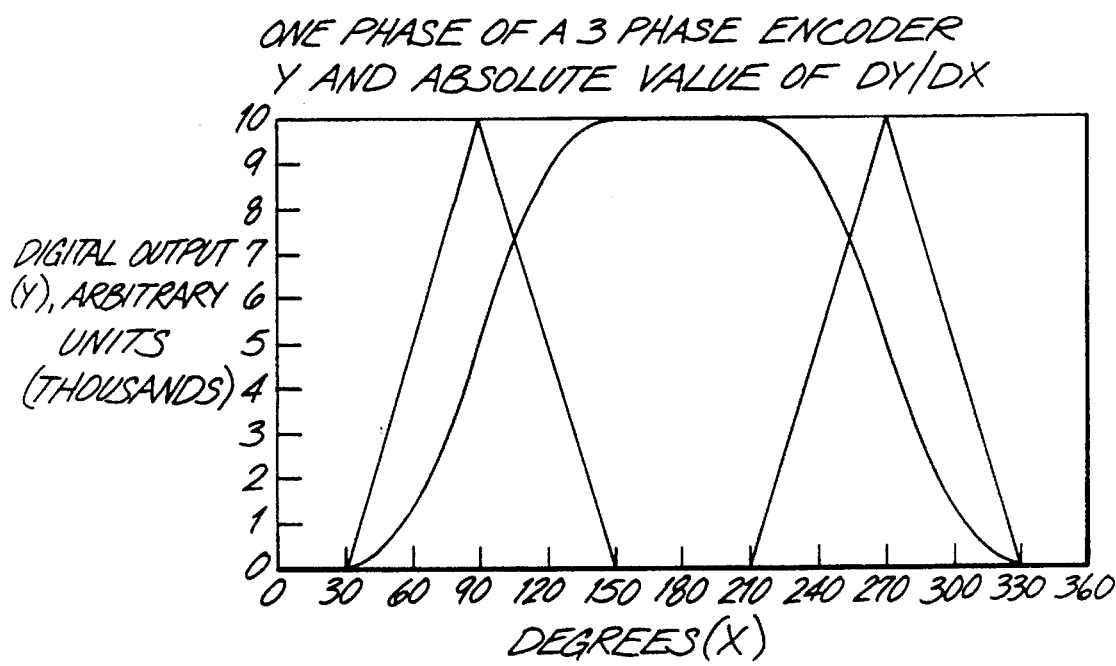
Figure 11:
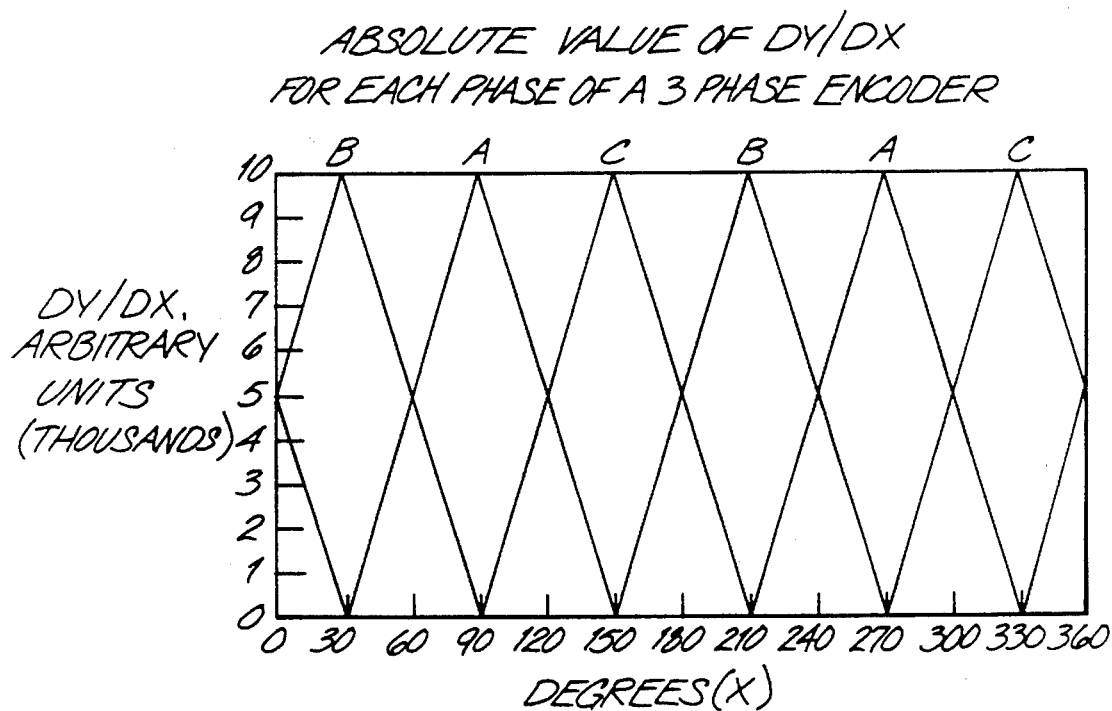
FIG. 11 shows the absolute values of DY/DX for each of the three phase signals shown in FIG. 9. From inspection of FIG. 11 it can be seen that for any value of the input X, the sum of the three values of DY/DX is a constant value which in this example is 10,000.

The analog signals shown in FIGS. 9, 10 and 11 are obtained when the encoder is designed to produce a signal such that DY/DX has a triangular wave shape as shown in FIG. 11. I have choosen this example because the optical encoders described in this disclosure produce an output that closely approximates this example. Many other waveshapes are suitable, it is only necessary (as stated above) that the absolute values of DY/DX summed over all phases closely approximate a constant value. The closer the approximation, the more accurate the encoder.

Figure 13:
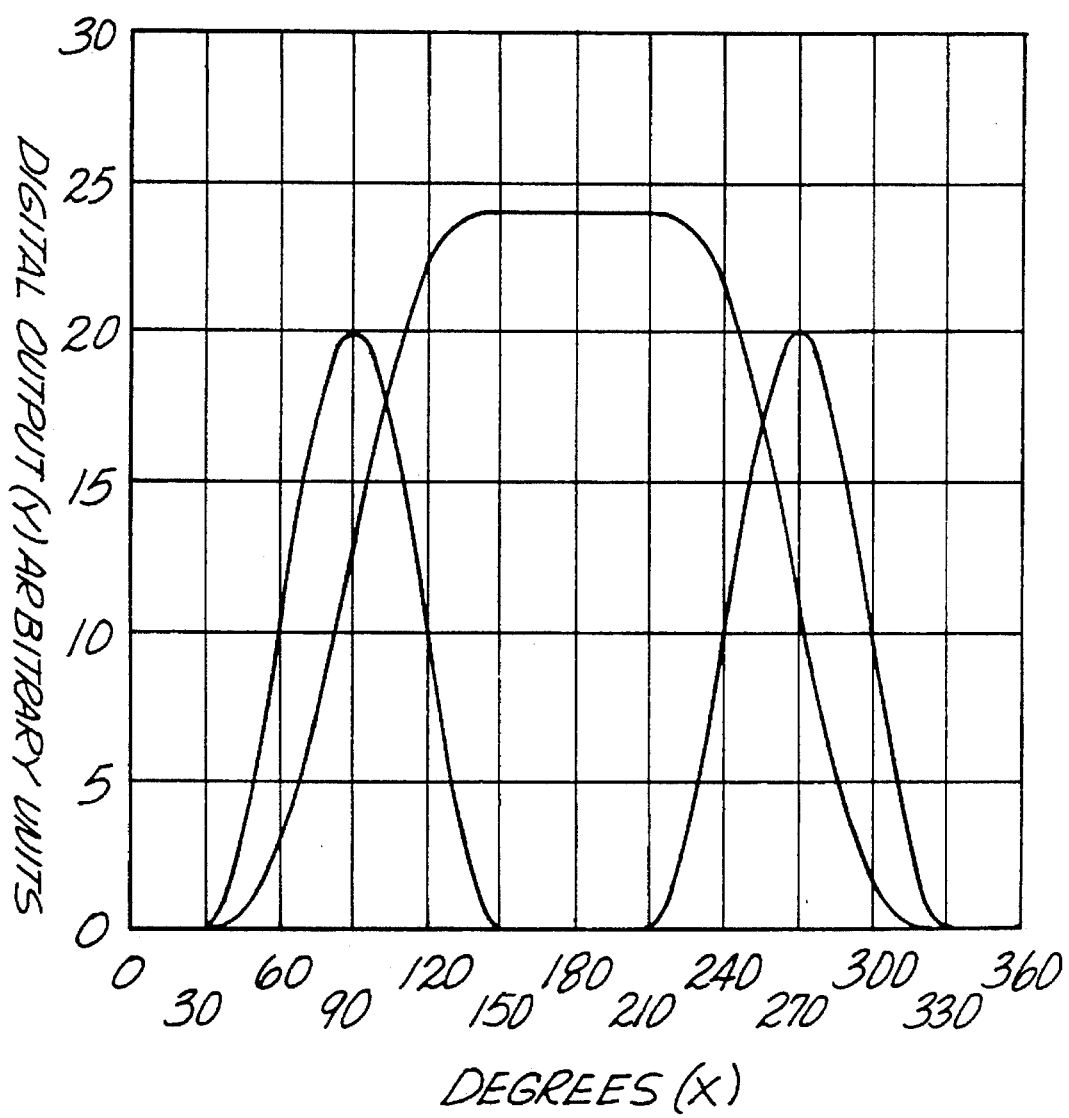
Figure 14:
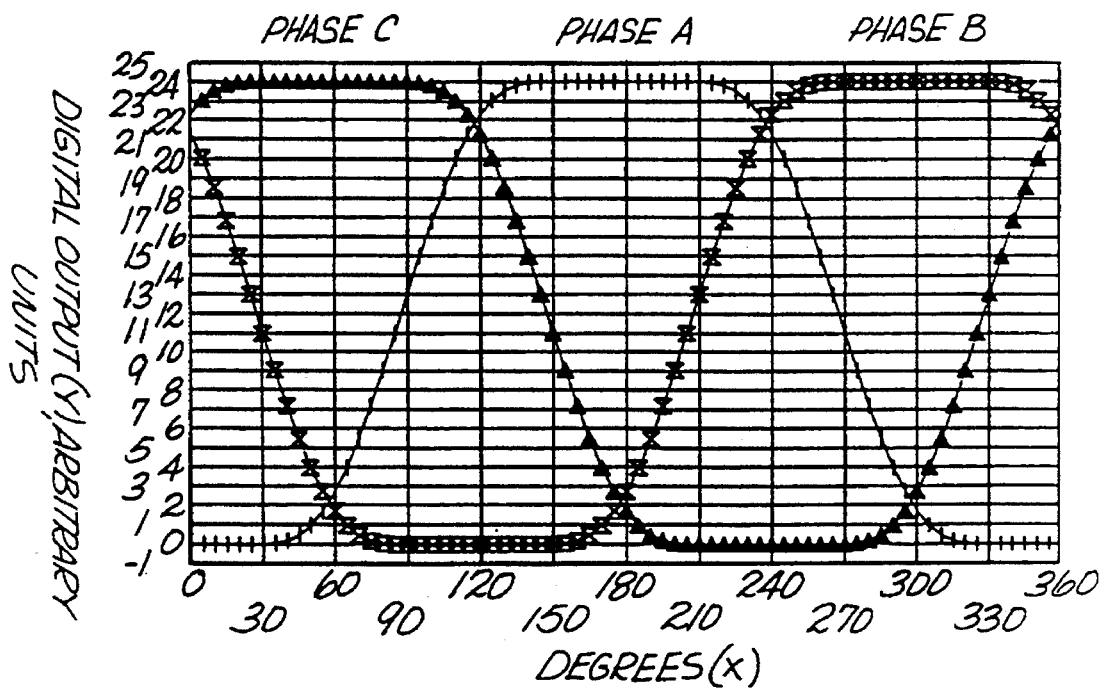
Figure 15:
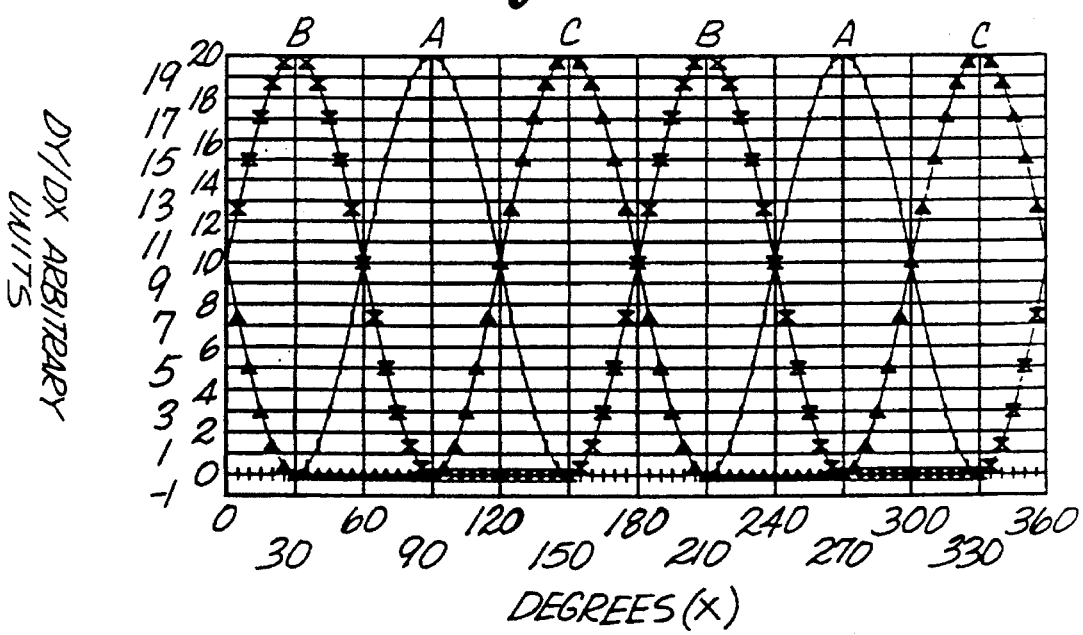

To illustrate that other signal wave shapes produce similar results, I have shown in FIGS. 13, 14, and 15 the signals from a 3 phase encoder in which DY/DX has the value 1-Cosine 3X over a 120 degree sector and has a value zero of the adjacent 60 degree sector. FIG. 14, shows threes such signals spaced at 120 degree intervals to form a three phase output. A three phase signal can also be formed using 60 degree intervals, this is equivalent to inverting phase A, i.e., A inverted=Am−A.

FIG. 13 shows the relationship of the output Y to the slope DY/DX for phase A of FIG. 14. For purposes of illustration, DY/DX is 10(1−Cosine 3X). FIG. 15 shows the absolute value of DY/DX for all three phases. It can be seen from inspection, that in this example, the sum of these three signals is 20 for any value of X.

In summary, FIGS. 9, 10, and 11 show a set of three phase encoder signals that can be closely approximated by the optical encoder designs described in this disclosure. FIGS. 13, 14, and 15 show an alternate set of three phase encoder signals that may be more easily created using magnetic, capacitive or inductive transducers. Beyond these two examples, other waveshapes may be choosen to fit other requirements.

Either set of three phase signals can be normalized and linearized using the method shown in FIG. 12.

B. CORRECTING FOR NON LINEARITY

1. Repeatability

Figure 6:
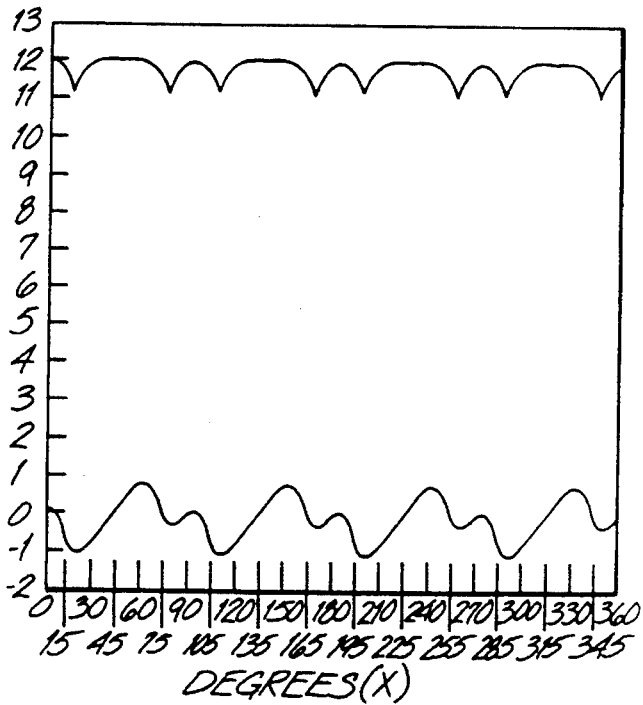

FIG. 6 shows one source of error in the encoder output KLIN. Similar errors result from mechanical imperfections in the parts or the assembly of the encoder.

Typically these errors are independent of changes in the operating environment and are constant over the life of the encoder. For this reason, it is practical, as a part of the manufacturing process, to store calibration data for the encoder. If the encoder includes a microprocessor, the calibration data are loaded directly to non- volatile memory. If not, the calibration data are shipped separately, for example, in a floppy disc to be loaded by the encoder user into his signal processing equipment.

2. Interpolation

Figure 16A:
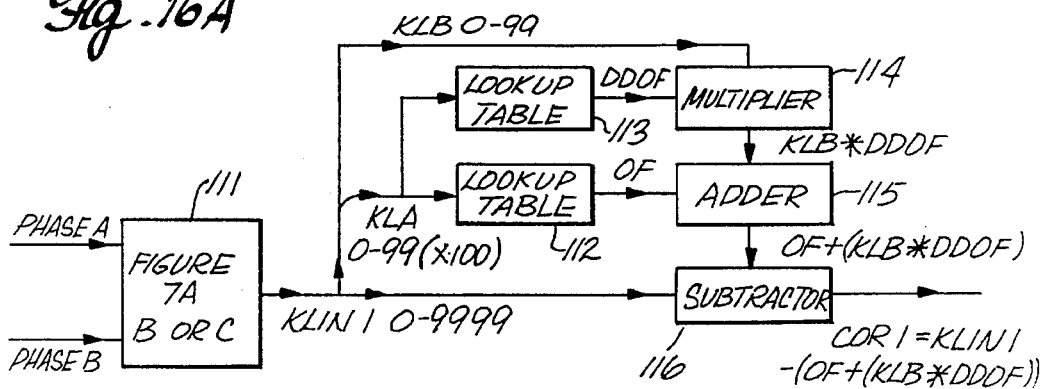

FIG. 16A is a block diagram of a method to correct the output KLIN. This method uses interpolation to reduce the amount of calibration data that must be stored in the computer memory. The method separates KLIN into the most significant digits (KLA) and the least significant digits (KLB). For example, if KLIN ranges from 0000 to 9999, KLA has 100 possible values from 0000 to 9900. KLB also has 100 possible values from 00 to 99. The correction table stores a correction term (OFn) for each value of KLAn. To speed the computation, a second lookup table may be used to store the value DDOF=OFn+1−OFn. Alternately, DDOF may be computed each time from the contents of the OFn lookup table.

The corrected output (COR) is computed as follows:

$$COR=KLIN-(OF+(KLB*DDOF))$$

3. Simplified Correction Methods

Figure 16B:
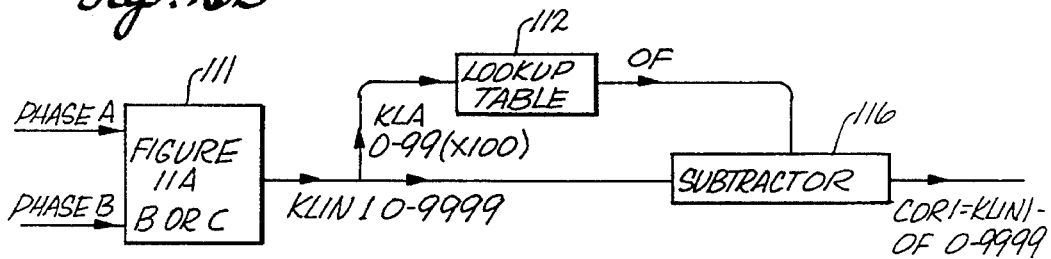

FIG. 16B omits the second lookup table, the multiplier and the adder. This method is used when the encoder errors are small and DDOF is not greater than plus or minus one.

Figure 16C:
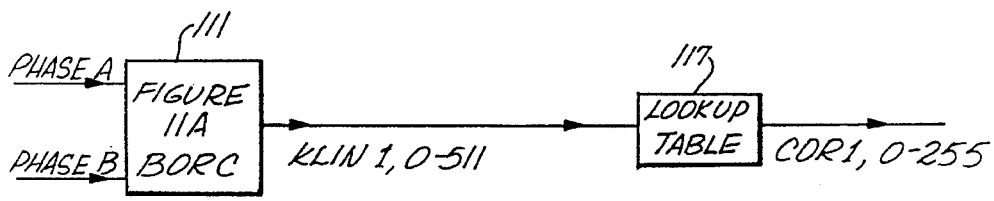

FIG. 16C shows a method that may be used for low resolution encoders. This method is fast but requires a larger lookup table and it reduces the useful resolution by a factor of two. The example in FIG. 16C employs 9 bits to represent KLIN1 and provides an 8 bit output to represent COR1.

C. AN ENCODER THAT COMBINES 1 CYCLE/REV. AND N CYCLES/REV. TO INCREASE THE RESOLUTION OF THE ENCODER N TIMES

1. Use the Periphery of the Disc to Get 1 Cycle/Rev. and a Circular Row of N Slots to Get N Cycles/Rev.

FIG. 17 shows an encoder disc that combines the rotary disc shown in FIG. 1 with a second track formed by row of 32 slots inside the minimum radius of the disc. The edges of the slots are formed by 64 equally spaced radial lines, i.e., the edges are spaced at 5.625 degree intervals. These slots modulate the light between two source-sensor pairs that are aligned with slits 125 and 126 to produce a two phase analog signal with 32 cycles per revolution of the disc. The maximum radius of the slit is slightly less than the maximum radius of the slot. The minimum radius of the slit is slightly greater than the minimum radius of the slot. The edges of the slit are radial lines and the angular width of the slit is 5/6 the angular width of the slot. In this example, the angular width of the slit is 4.6875 degrees.

Figure 3:
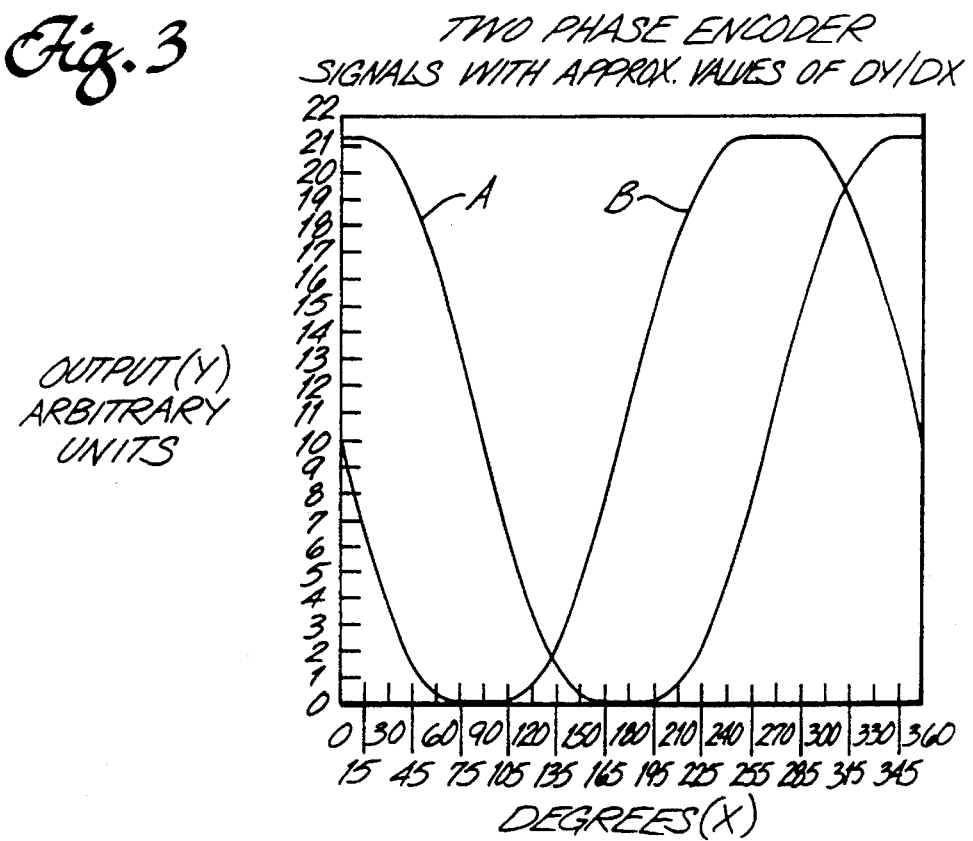
Figure 4:
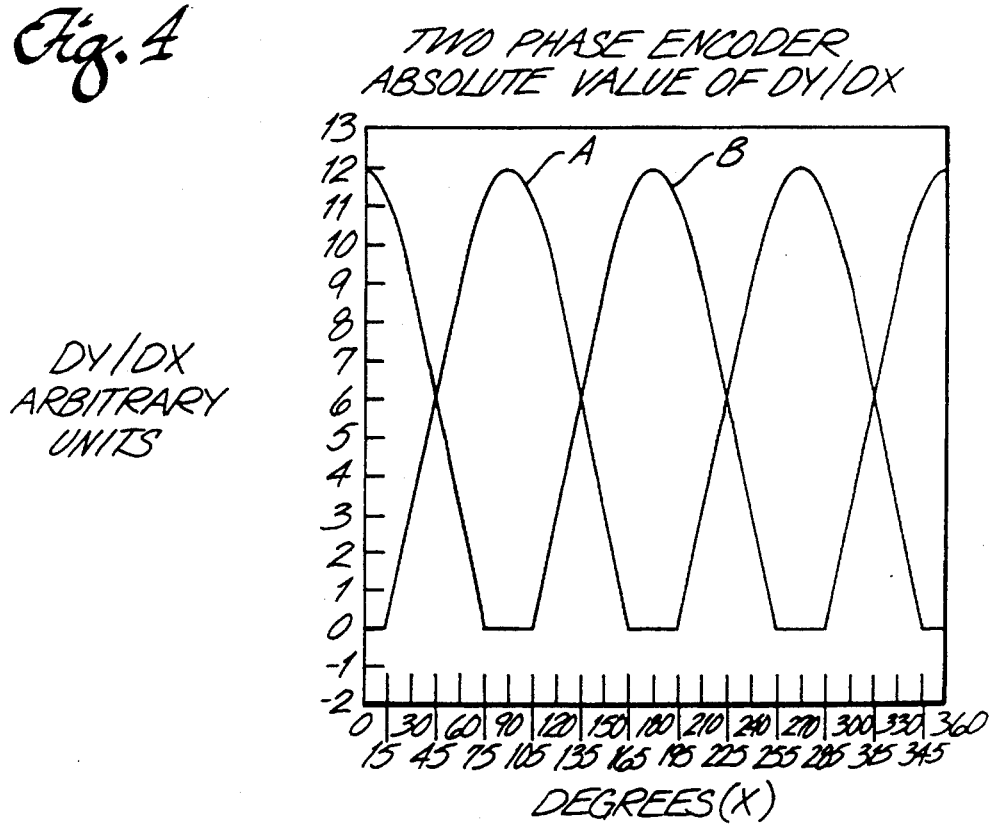
Figure 5:
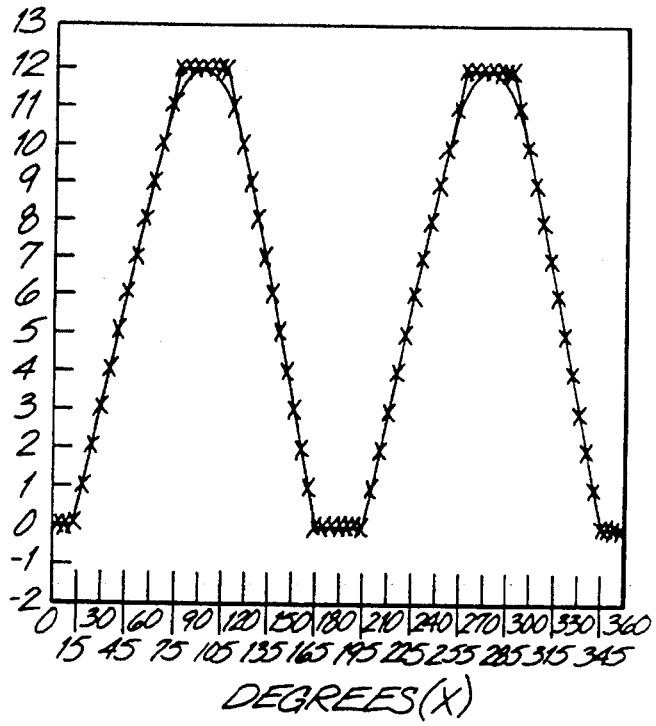

These dimensions produce a cyclic analog signal with a maximum and minimum value that is constant over an angle equal to 1/6 of the angular width of the slot or 0.9375 degrees. This angle multiplied by 32 is 30 degrees. This results in an analog signal that has the same shape as the two phase signals shown in FIG. 3, but repeated 32 times per revolution.

Phase A32 is generated by a source-sensor pair aligned with slit 125. Slit 125 is shown located in the center of one of the slots. This position of the disc has been arbitrarily selected as the zero position for the X32 output. In this view, positive rotation is counter-clockwise. To be consistent with paragraph A1, the center of slit 126 which generates phase B32 must be aligned with the clockwise edge of one of the other slots. For the best accuracy it is preferable to select the nearest slot consistent with the physical size of the sources and sensors.

The source-sensor pairs aligned with slit 127 generate phase A1 and the source-sensor pairs aligned with slit 128 generate phase B1 of the one cycle per revolution signal. Slits 127 and 128 have an angular spacing of 90 degrees. At the position of the disc shown in FIG. 17, phase A1 output is about equal to the phase B1 output and referring to FIG. 3, these values correspond to the disc having a rotary position of about 135 degrees with respect to the zero position defined in paragraph 1.

2. For Example, combine A32, B32, A1, and B1 to Obtain Linear Output that Repeats Once Per Revolution with 32 Times the Resoltuion.

Figure 7D:
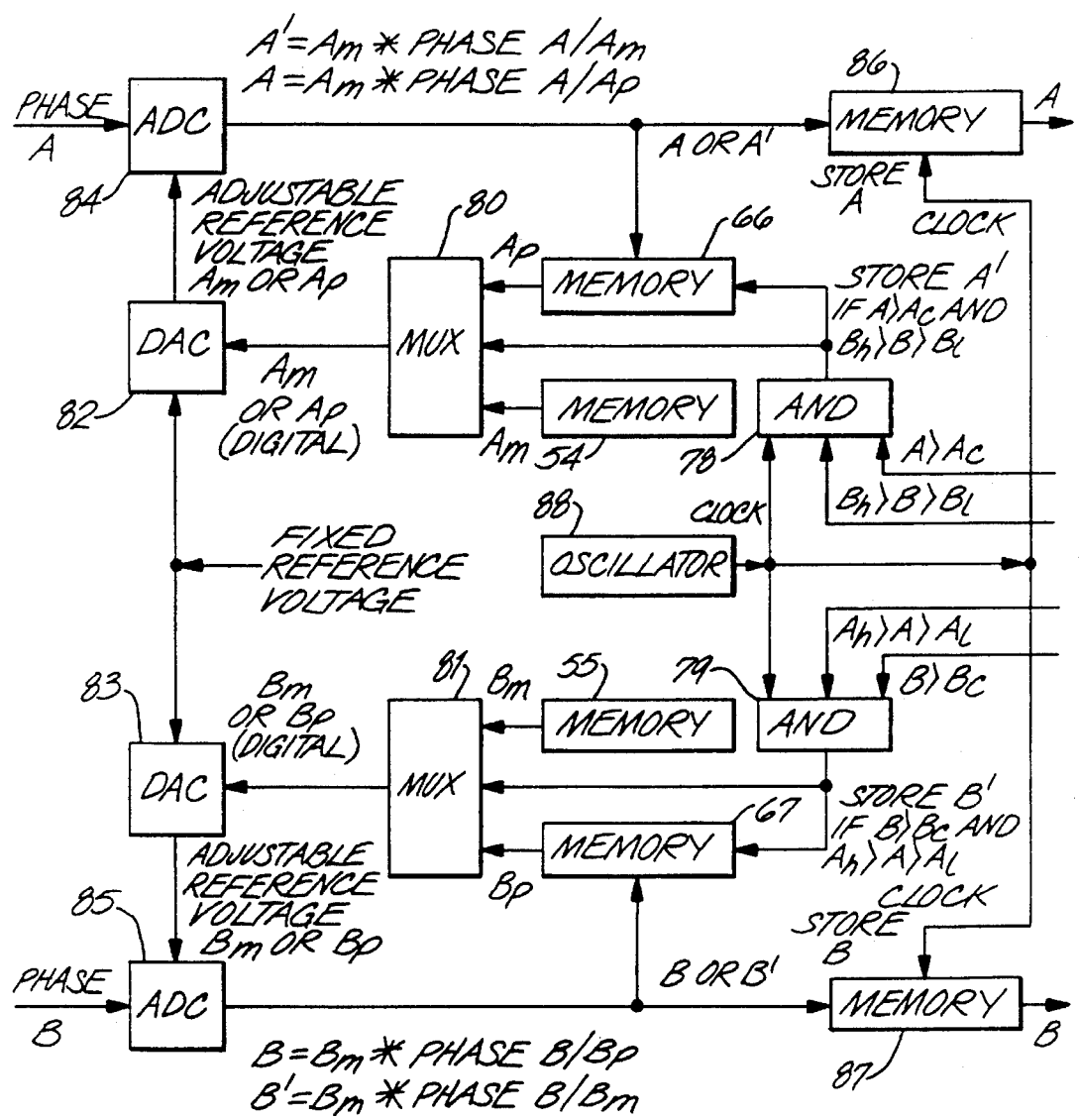
Figure 8:
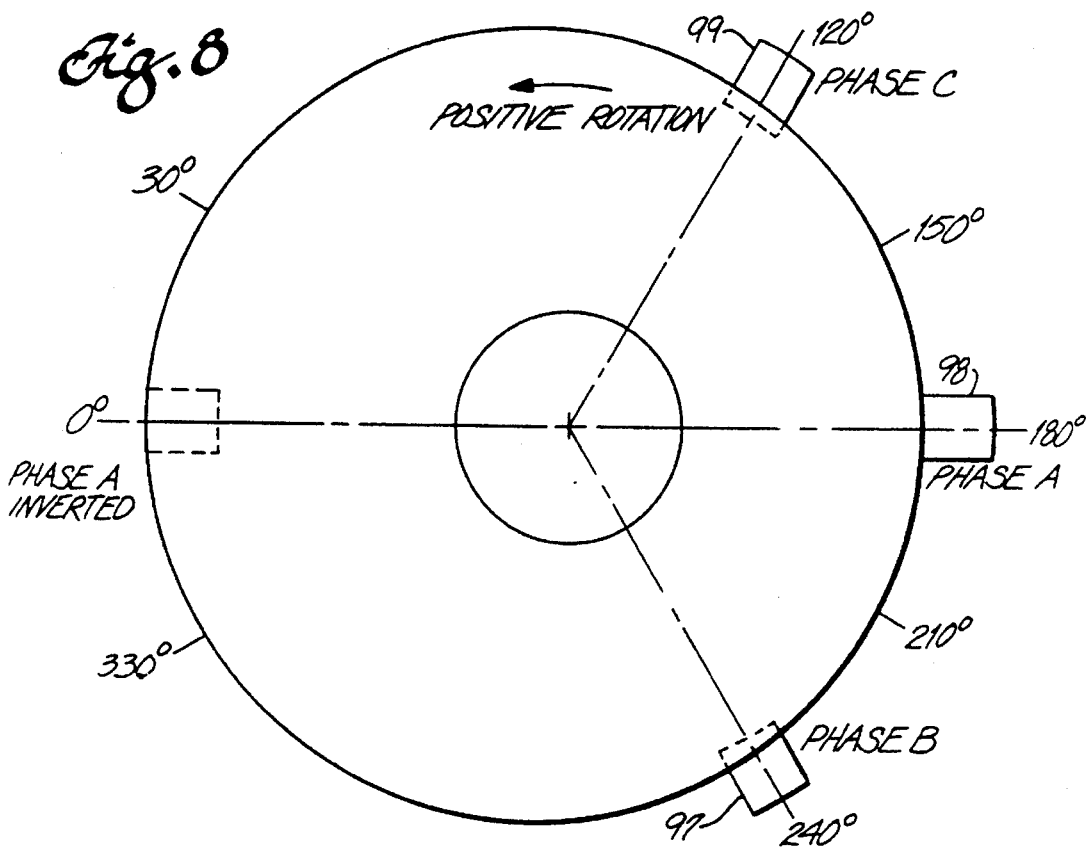

FIG. 18 uses the method shown in FIG. 7B to obtain KLIN1 from phase A1 and phase B1 and to obtain KLIN32 from phase A32 and phase B32. KLIN1 is corrected to obtain COR1 and KLIN32 is corrected to obtain COR32 using the method shown in FIGS. 16A or 16B or 16C as required by the size of the error to be corrected.

COR1 is multiplied by 32 and the result is separated into the most significant digits 32COR1A (which have a range of values from 0 to 31) and the least significant digits 32COR1B (which have the same range of values as COR32). In this example, COR1 and COR32 have a range of values of 0 to 9999. The range of values selected for convenience in computing and is limited by the resolution of the ADC and by the requirements of the application. Usually the maximum value is 1 less than some power of 2, for example 511, 1023, or 4095.

32COR1B is subtracted from COR32 to obtain DIF. If DIF is negative, 32COR1A is increased by 1. If the result is 32, substitute 0. The result identifies which of the 32 slots generated phase A32 and phase B32. In this example, the result is the two most significant decimal digits of a six decimal digit number NX identifying the position of the disc.

The value NX was computed using the value COR32 which is the corrected value of KLIN32. The correction using Table 1 is complete only if all 32 slots are identical. In general, the slots are not identical and a further improvement in accuracy may be obtained using a third lookup table that employs the most significant digits of NX as a table address. The example in FIG. 18 uses the three most significant decimal digits of NX, the values 0 to 319, to locate the correction terms OF and DDOF. The corrected output N equals NX−(OF+DDOF, NXB). In this example, NXB is the three least significant decimal digits of NX.

D. AN ENCODER THAT COMBINES N CYCLES/REV. AND N−1 CYCLES/REV. TO INCREASE THE RESOLUTION OF THE ENCODER N TIMES

1. Use a Circular Track of N Slots and a Second Circular Track of N−1 (or N+1) Slots to Get the Absolute Value of N Cycles/Rev.

Figure 19:
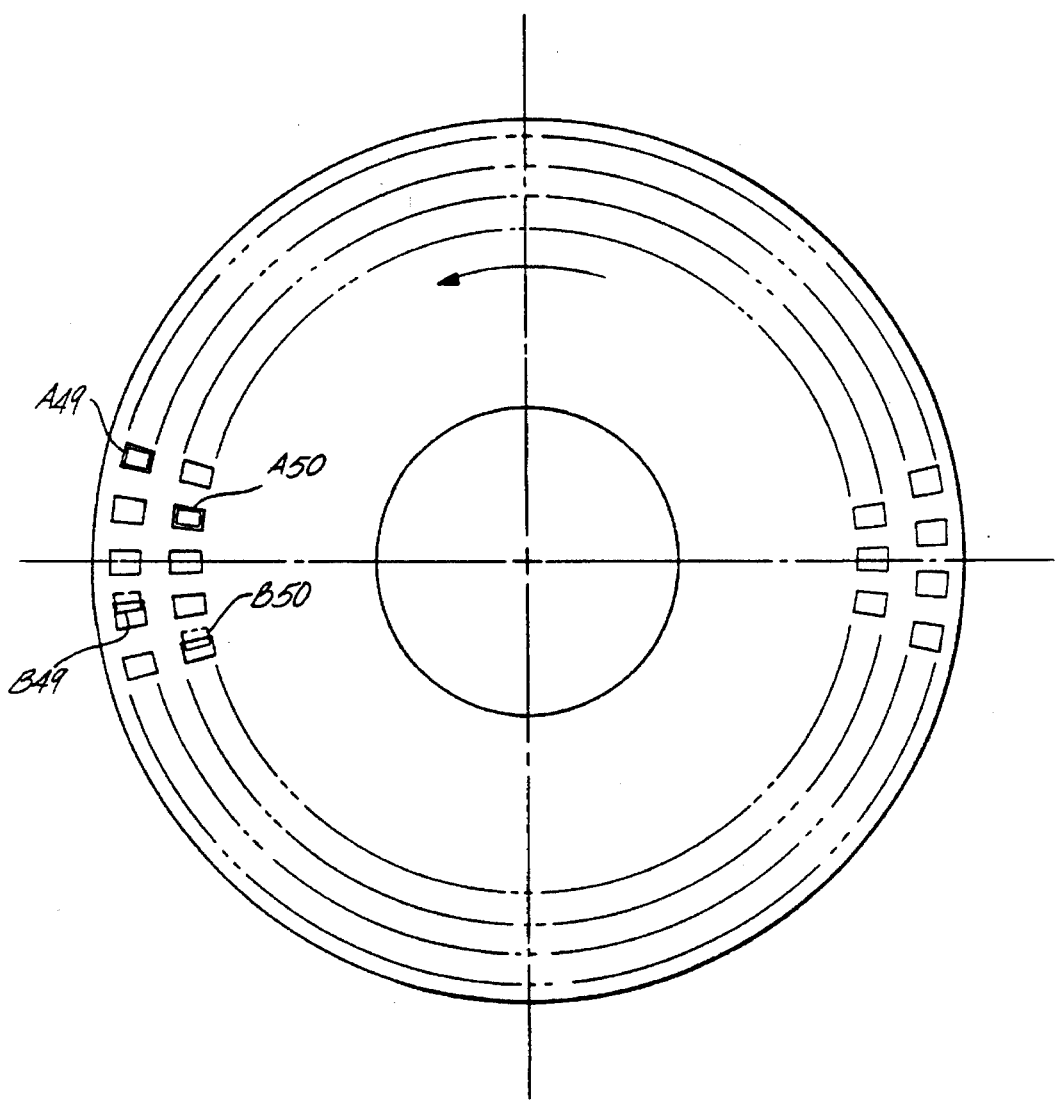

FIG. 19 shows an encoder disc with a circular periphery, with a first track formed by a row of 49 slots inside the minimum radius of the disc and with a second track formed by a row of 50 slots inside the row of 49 slots. The edges of the outer row of slots are formed by 98 equally spaced radial lines, and the edges of the inner row of slots are formed by 100 equally spaced lines, i.e., the edges of the inner row are are spaced at 3.6 degree intervals. The inner row of slots modulate the light between two source-sensor pairs that are aligned with slits A50 and B50 to produce a two phase analog signal with 50 cycles per revolution of the disc. The outer row of slots modulate the light between two additional source-sensor pairs that are aligned with slits A49 and B49 to produce a two phase analog signal with 49 cycles per revolution. The maximum radius of each slit is slightly less than the maximum radius of the associated row of slots. The minimum radius of each slit is slightly greater than the minimum radius of the associated row of slots. The edges of the slits are radial lines and the angular width of the slits is 5/6 the angular width of the associated slot. In this example, the angular width of the slits A50 and B50 is 3.0 degrees.

For the inner track, these dimensions produce a cyclic analog signal with a maximum and minimum value that is constant over an angle equal to 1/6 of the angular width of the slot or 0.6 degrees. This angle multiplied by 50 is 30 degrees. This results in an analog signal that has the same shape as the two phase signals shown in FIG. 3, but repeated 50 times per revolution.

For the outer track, the angular dimensions are increased by the ratio of 50/49. The result is a two phase signal of the same shape but repeated 49 times per revolution.

Phase A50 is generated by a source-sensor pair aligned with slit A50. Slit A50 is shown located in the center of one of the inner row of slots. This position of the disc has been arbitrarily selected as the zero position for the X50 output. In this view, positive rotation is counter-clockwise. To be consistent with paragraph A1, the center of slit B50 which generates phase B50 must be aligned with the clockwise edge of one of the other slots. For the best accuracy it is preferable to select the nearest slot consistent with the physical size of the sources and sensors.

Phase A49 is generated by a source-sensor pair aligned with slit A49. Slit A49 is shown located in the center of one of the outer row of slots. This position of the disc is also the zero position for the X49 output and the center of slit B49 which generates phase B49 must be aligned with the clockwise edge of one of the other slots in the outer track. The source-sensor pairs aligned with slit B49 generate phase B49 of the 49 cycle per revolution signal.

2. For example, Combine A50, B50, A49, and B49 to obtain a Linear Output that Repeats Once Per Revolution with 50 Times the Resolution of the 50 Slot Track.

FIG. 20 uses the method shown in FIG. 7B to obtain KLIN49 from phase A49 and phase B49 and to obtain KLIN50 from phase A50 and phase B50. KLIN49 is corrected to obtain COR49 and KLIN50 is corrected to obtain COR50 using the method shown in FIGS. 16A or 16B or 16C as required by the size of the error to be corrected.

To obtain COR1, COR 50 is subtracted from COR 49. If the result is negative, a constant (10,000 in this example) is added such that COR1 is always positive.

COR1 is multiplied by 50 and the result is separated into the most significant digits 50COR1A (which have a range of values from 0 to 49) and the least significant digits 50COR1B (which have the same range of values as COR50). In this example, COR49 and COR50 have a range of values of 0 to 9999. The range of values selected for convenience in computing and is limited by the resolution of the ADC and by the requirements of the application. Usually the maximum value is 1 less than some power of 2, for example 511, 1023, or 4095.

50COR1B is subtracted from COR50 to obtain DIF. If DIF is negative, 50COR1A is increased by 1. If the result is 50, substitute 0. The result identifies which of the 50 slots (0–49) generated phase A50 and phase B50. In this example, the result is the two most significant decimal digits of a six decimal digit number NX identifying the position of the disc.

The value NX was computed using the value COR50 which is the corrected value of KLIN50. The correction using Table 1 is complete only if all 50 slots are identical. In general, the slots are not identical and a further improvement in accuracy may be obtained using a third lookup table that employs the most significant digits of NX as a table address. The example in FIG. 18 uses the three most significant decimal digits of NX, the values 0 to 499, to locate the correction terms OF and DDOF. The corrected output N equals NX−(OF+DDOF*NXB). In this example, NXB is the three least significant decimal digits of NX.

An Appendix which provides a source code listing for a Motorola microcontroller implementing the function of the disclosed invention is attached hereto and incorporated by reference.

What is claimed is:

1. An absolute encoder comprising:

a measuring scale with one or more tracks, a plurality of analog sensors per track, each sensor having an output modulated by a corresponding track to generate a plurality of cyclic nonsinusoidal multiphase analog signals from the sensors indicative of a relative position of the sensors and the measuring scale, analog to digital conversion means to produce digital values proportional to the analog signals, means to conditionally add or subtract the digital values of the analog signals to obtain a single output that increases linearly in proportion to the position of the sensors relative to the measuring scale.

2. The encoder of claim 1 in which the analog signals have a maximum value that is constant over part of the cycle, and a minimum value that is constant over part of the cycle.

3. The encoder of claim 2 in which the means to conditionally add or subtract switches between an adding mode and a subtracting mode while one of the analog signals is constant.

4. The encoder of claim 3, in which each of the analog signals from one or more tracks has a maximum value that is constant for at least 1/25 of its cycle and has a minimum value that is constant for at least 1/25 of its cycle.

5. The encoder of claim 3, in which the analog signals from one or more tracks are a two phase signal with phasing equal to ¼ of its cycle and with minimum and maximum values that are constant for about 1/12 of its cycle.

6. The encoder of claim 3 for converting the output signals from the sensors designated phase A and phase B, to a single output that increases linearity in proportion to the relative position of the sensors and the measuring scale comprising:

a first analog to digital converter connected to the phase A output of the encoder with a digital output of value A;

a second analog to digital converter connected to the phase B output of the encoder with a digital output of value B;

a first memory register containing an output of value Ac equal to the digital value of phase A when phase B is a maximum;

a second memory register containing an output of value Bc equal to the digital value of phase B when phase A is a maximum;

a first comparator means connected to the output A of the first analog to digital converter and to the output Ac of the first memory register such that the comparator output is true when A>Ac;

a second comparator means connected to the output B of the second analog to digital converter and to the output Bc of the second memory register such that the comparator output is true when B>Bc;

a third memory register containing a value Am equal to the maximum digital value of phase A;

a fourth memory register containing a value Bm equal to Am and to the maximum digital value of phase B; and an adder means connected to the outputs of the first and second analog to digital converters and to the outputs of the second, third and fourth memory registers and to the outputs of the first and second comparator means such that if A>Ac and B<=Bc, then the output is Am+Bc−A−B, else if A<=Ac and B<=Bc, then the output is Am+Bc−A+B, else if A<=Ac and B>Bc, then the output is Am+Bc+A+B, else if A>Ac and B>Bc, then the output is Am+Bc+A−B+2Bm.

7. The encoder of claim 3, in which the analog signals from one or more tracks are a three phase signal with phasing equal to 1/6 of its cycle and with minimum and maximum values that are constant for about 1/6 of its cycle.

8. The encoder of claim 3, in which the analog signals from one or more tracks are a three phase signal with phasing equal to ⅓ of its cycle and with minimum and maximum values that are constaint for about 1/6 of its cycle.

9. The encoder of claim 3, in which the analog signals from one or more tracks are a four phase signal with phasing equal to ⅛ of its cycle and with minimum and maximum values that are constant for about ¼ of its cycle.

10. An absolute encoder comprising:

a measuring scale with one or more tracks, two or more analog sensors per track, each sensor having an output modulated by the corresponding track to generate cyclic analog signals from the sensors indicative of the relative position of the sensors and the measuring scale wherein the sum of absolute values of slopes of all the analog signals from any one track approximates a constant, analog to digital conversion means to produce digital values proportional to the analog signals, means to conditionally add or subtract the digital values of the analog signals to obtain a single output that increases linearly in proportion to the position of the sensors relative to the measuring scale.

11. The encoder of claim 4, in which each of the analog signals from one or more tracks has a maximum value that is constant for at least 1/25 of its cycle and has a minimum value that is constant for at least 1/25 of its cycle.

12. The encoder of claim 10, in which the analog signals from one or more tracks are a two phase signal with phasing equal to ¼ of its cycle and with minimum and maximum values that are constant for about 1/12 of its cycle.

13. The encoder of claim 10, in which the analog signals from one or more tracks are a three phase signal with phasing equal to 1/6 of its cycle and with minimum and maximum values that are constant for about 1/6 of its cycle.

14. The encoder of claim 10, in which the analog signals from one or more tracks are a three phase signal with phasing equal to ⅓ of its cycle and with minimum and maximum values that are constant for about 1/6 of its cycle.

15. The encoder of claim 10, in which the analog signals from one or more tracks are a four phase signal with phasing equal to ⅛ of its cycle and with minimum and maximum values that are constant for about ¼ of its cycle.

16. A shaft position encoder comprising:

an input shaft;

a disc coupled to the input shaft, the disc having a minimum and a maximum radius;

a contoured periphery of the disc including:
  a first section of the periphery over which the radius is a constant and is a maximum,
  a second section of the periphery over which the contour is a spiral with the radius decreased by a constant amount for each increment of angular rotation,
  a third section of the periphery equal to the first section over which a radius is a constant and is a minimum,
  a fourth section of the periphery equal to the second section over which the contour is a spiral with the radius increased at the same rate per angular increment as the radius is decreased in the second section;

a first optical source and a first optical sensor forming a first optical beam passing from the first source through a plane of the disc to the first sensor with a second a first optical axis perpendicular to a plane of the disc at a radial distance midway between the minimum and maximum radius of the disc;

a second optical source and a second optical sensor forming a second optical beam passing from the second source through a plane of the disc to the second sensor with a second optical axis parallel to the first optical axis and at the same radial distance but displaced circumferentially by 90 degrees.

17. The encoder of claim 16, additionally comprising a first slit plate between the first and second optical source sensors and the disc and parallel to the disc which is opaque except for slits aligned with the first and second optical axes such that the slits limit the cross section area of the optical beams and a second slit plate between the disc and the first and second optical source sensors and parallel to the disc which is also opaque except for slits aligned with the first and second optical axes to further limit the cross sectional area of the optical beams.

18. The encoder of claim 17, in which the first and third sections are 30 degrees and the second and fourth sections are 150 degrees.

19. A shaft position encoder comprising:

an incrementally rotatable input shaft;

a disc coupled to the input shaft, the disc having a minimum and a maximum radius;

a contoured periphery of the disc including:
  a first section of the periphery over which the radius is a constant and is a maximum,
  a second section of the periphery over which the contour is a spiral with the radius decreased by a constant amount for each increment of angular rotation,
  a third section of the periphery equal to the first section over which the radius is a constant and is a minimum,
  a fourth section of the periphery equal to the second section over which the contour is a spiral with the radius increased at the same rate per angular increment as the radius is decreased in the second section;

a first optical source-sensor pair with a first optical axis perpendicular to the plane of the disc at a radial distance midway between the minimum and maximum radius of the disc;

a second optical source-sensor pair with a second optical axis parallel to the axis of the first pair and at the same radial distance but displaced circumferentially by 60 degrees from the first pair;

a third optical source-sensor pair with a third optical axis parallel to the axis of the first pair and at the same radial distance but displaced circumferentially by 120 degrees for the first pair.

20. The encoder in claim 19, where the circumferential displacement of the second pair is 120 degrees and the circumferential displacement of the third pair is 240 degrees.

21. The encoder of claim 20, in which the first and second sections are 60 degrees and the second and fourth sections are 120 degrees.

22. The encoder of claim 19, in which the first and second sections are 60 degrees and the second and fourth sections are 120 degrees.

23. The encoder of claim 3 for correcting the values of the analog signals, designated phase A and phase B, comprising:

a first analog to digital converter connected to the phase A output of the encoder with a digital output of value A';

a second analog to digital converter connected to the phase B output of the encoder with a digital output of value B';

a first multiplier means connected to the output of the first analog to digital converter with a digital output A;

a second multiplier means connected to the output of the second analog to digital converter with a digital output B;

a first memory register containing the values Ah and A1 which are selected such that the encoder output B' is a maximum when Ah>A>A1;

a second memory register containing the values Bh and B1 which are selected such that the encoder output A' is a maximum when Bh>B>B1;

a first comparator means connected to the output A of the first multiplier and to the outputs Ah and A1 of the first memory register such that the comparator output is true when Ah>A>A1;

a second comparator means connected to the output B of the second multiplier and to the outputs Bh and B1 of the second memory register such that the comparator output is true when Bh>B>B1;

a third memory register containing the value Ac which is the average of Ah and A1;

a fourth memory register containing the value Bc which is the average of Bh and B1;

a third comparator means connected to the output A of the first multiplier and to the output Ac of the third memory register such that the comparator output is true when A>Ac;

a fourth comparator means connected to the output B of the second multiplier and to the output Bc of the fourth memory register such that the comparator output is true when B>Bc;

a fifth memory register with the input connected to the output of the first analog to digital converter, with the output connected to the first multiplier and controlled by the second comparator means and the third comparator means to store the value Ap when Bh>B>Bl and A>Ac;

a sixth memory register with the input connected to the output of the second analog to digital converter, with the output connected to the second multiplier and controlled by the first comparator means and the fourth comparator means to store the value Bp when Ah>A>Al and B>Bc;

a seventh memory register with an output connected to the first multiplier and containing a constant Am equal to the corrected maximum digital value of phase A;

an eighth memory register with an output connected to the second multiplier and containing a constant Bm equal to the corrected maximum digital value of phase B;

whereby the output A of the first multiplier equals A' times Am divided by Ap and the output B of the second multiplier equals B' times Bm divided by Bp;

an adder means connected to the outputs of the first and second multipliers and to the outputs of the second, seventh and eighth memory registors and to the outputs of the first and second comparator means such that if A>Ac and B<=Bc, then the output is Am+Bc−A−B, else if A<=Ac and B<=Bc, then the output is Am+Bc−A+B, else if A<=Ac and B>Bc, then the output is Am+Bc+A+B, else if A>Ac and B>Bc, then the output is Am+Bc+A−B+ 2Bm.

\* \* \* \* \*